(12) United States Patent
Schnack et al.

(10) Patent No.: US 11,355,417 B2
(45) Date of Patent: Jun. 7, 2022

(54) FASTENING UNIT FOR CONNECTING THERMALLY STRESSED COMPONENTS TO EACH OTHER

(71) Applicant: Fachhochschule Kiel, Kiel (DE)

(72) Inventors: Jasper Schnack, Kiel (DE); Ulf Schümann, Kiel (DE)

(73) Assignee: Fachhochschule Kiel, Kiel (DE)

( * ) Notice: Subject to any disclaimer, the term of this patent is extended or adjusted under 35 U.S.C. 154(b) by 0 days.

(21) Appl. No.: 16/961,587

(22) PCT Filed: Dec. 21, 2018

(86) PCT No.: PCT/EP2018/086658
§ 371 (c)(1),
(2) Date: Jul. 10, 2020

(87) PCT Pub. No.: WO2019/137806
PCT Pub. Date: Jul. 18, 2019

(65) Prior Publication Data
US 2020/0365484 A1    Nov. 19, 2020

(30) Foreign Application Priority Data

Jan. 12, 2018 (DE) ...................... 10 2018 100 647.0
Jan. 12, 2018 (DE) ...................... 20 2018 100 161.2

(51) Int. Cl.
*H01L 23/40* (2006.01)
*H01L 23/13* (2006.01)

(52) U.S. Cl.
CPC .......... *H01L 23/4006* (2013.01); *H01L 23/13* (2013.01); *H01L 2023/4087* (2013.01)

(58) Field of Classification Search
None
See application file for complete search history.

(56) References Cited

U.S. PATENT DOCUMENTS 6,942,132 B2    9/2005    Oetlinger
8,100,600 B2    1/2012    Blum

FOREIGN PATENT DOCUMENTS

DE    6913764 U       11/1969
DE    19630173 A1      1/1998
(Continued)

OTHER PUBLICATIONS

English translation of DE 202005008256, pp. 1-7, Retrieved from the internet on Jul. 6, 2021 from https://dialog.proquest.com/professional/cv_2183530/docview/1131634272/179E268A9942B3A7640/1?accountid=131444 (Year: 2005).*

(Continued)

*Primary Examiner* — Bo B Jang
(74) *Attorney, Agent, or Firm* — Dicke, Billiig & Czaja, PLLC

(57) ABSTRACT

A fastening unit for connecting a heat-generating body to a heat sink is provided. The fastening unit includes a retaining pin and a retaining element wherein the retaining pin is connected to a retaining head. The retaining pin extends through the retaining element and the retaining head contacts the retaining element. The retaining element is engageable upon a body of the heat sink so as to retain same in a fastening direction of the retaining pin. The retaining element is engageable laterally on the body of the heat sink, the retaining element having, on a side thereof for facing the body of the heat sink, a retaining groove extending in a longitudinal direction perpendicular to the fastening direction. In an assembled state for the fastening unit, at least one groove surface of the retaining groove of the retaining element contacts the body of the heat sink.

17 Claims, 11 Drawing Sheets

(56) References Cited

FOREIGN PATENT DOCUMENTS

| DE | 10306227 A1 | 9/2004 |
| DE | 10353702 A1 | 6/2005 |
| DE | 202005008256 U1 | 9/2005 |
| DE | 202009014048 U1 | 2/2010 |
| JP | 60024041 A | 2/1985 |
| WO | 0062340 A1 | 10/2000 |

OTHER PUBLICATIONS

International Search Report and Written Opinion from PCT/EP2018/086658 with machine translation; 14 pages; Martin Kastner; dated Apr. 1, 2019.

International Search Report and Written Opinion from PCT/EP2018/086658 with machine translation; 10 pages; Martin Kastner; dated Apr. 1, 2019.

International Preliminary Report on Patentability from PCT/EP2018/086658 with machine translation; 12 pages; Nora Lindner; dated Jul. 14, 2020.

Examination Report for DE 102018100647.0 with machine translation; 12 pages; Dr. Oliver Sachs; dated Nov. 7, 2018.

\* cited by examiner

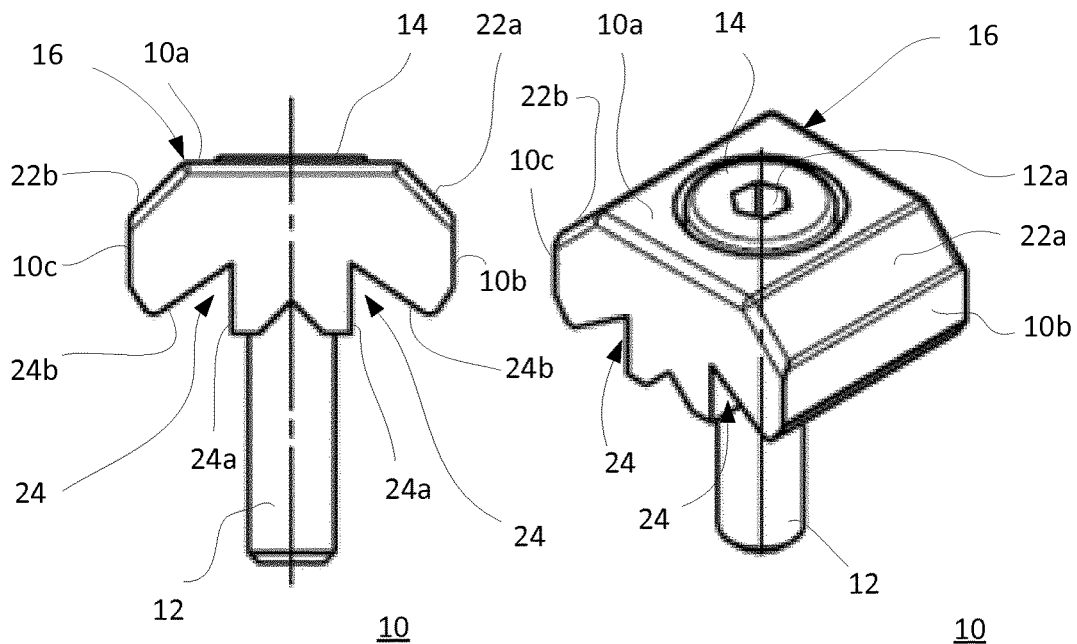
Fig. 2a  Fig. 2b
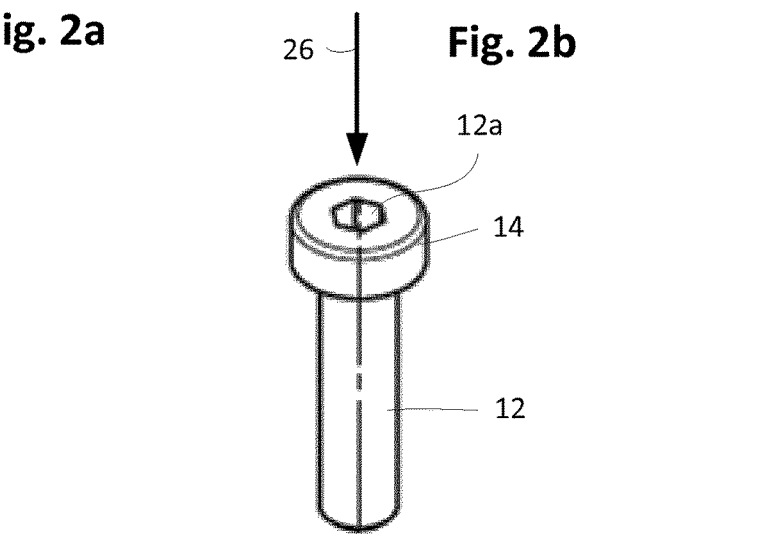
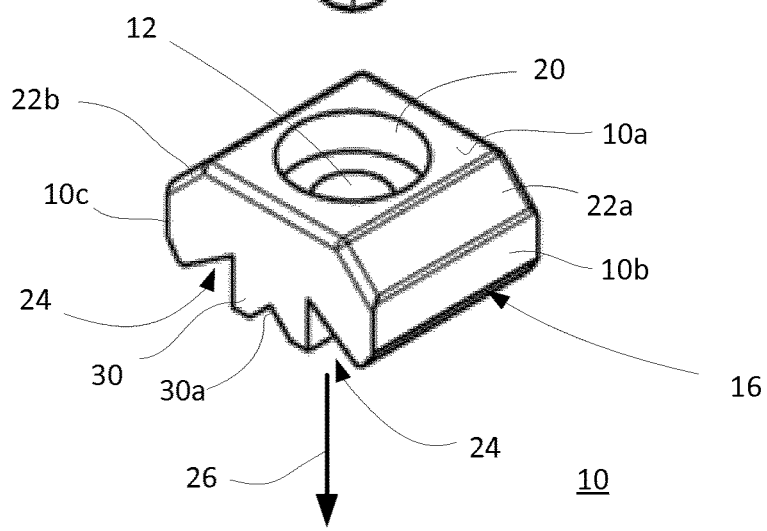
Fig. 2c

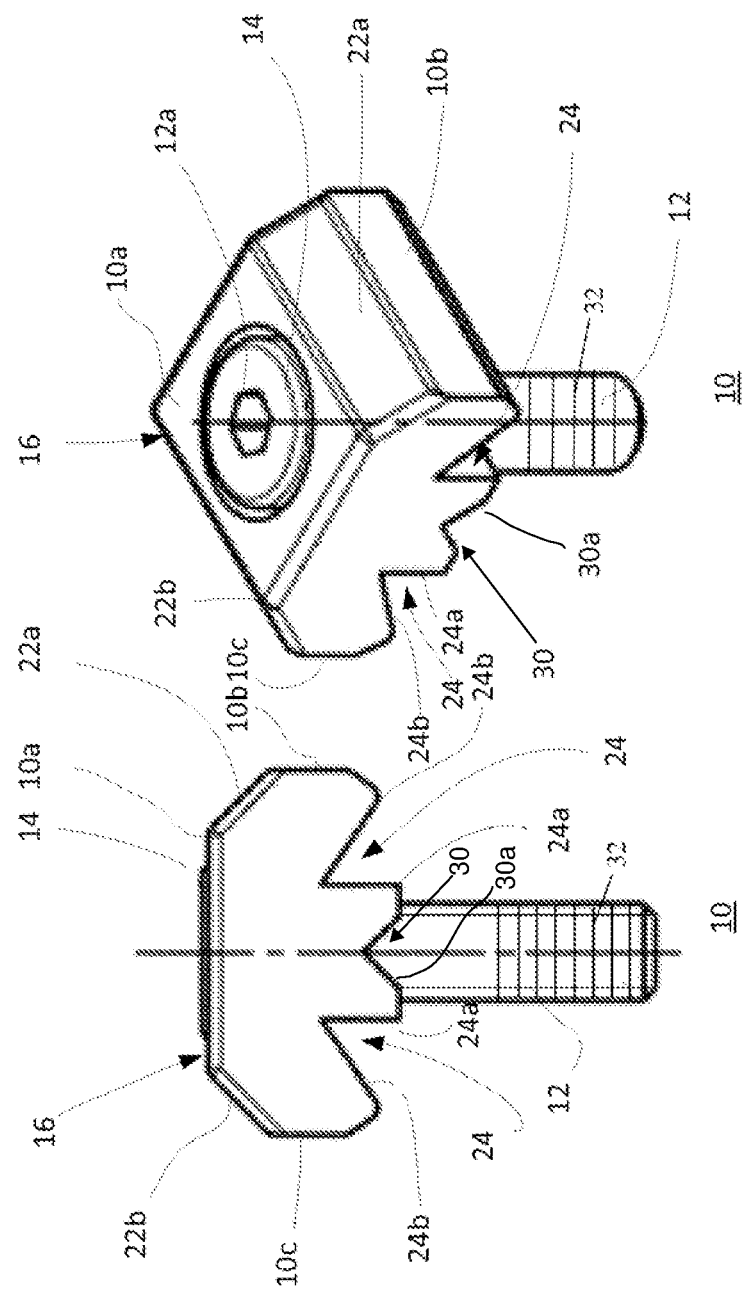

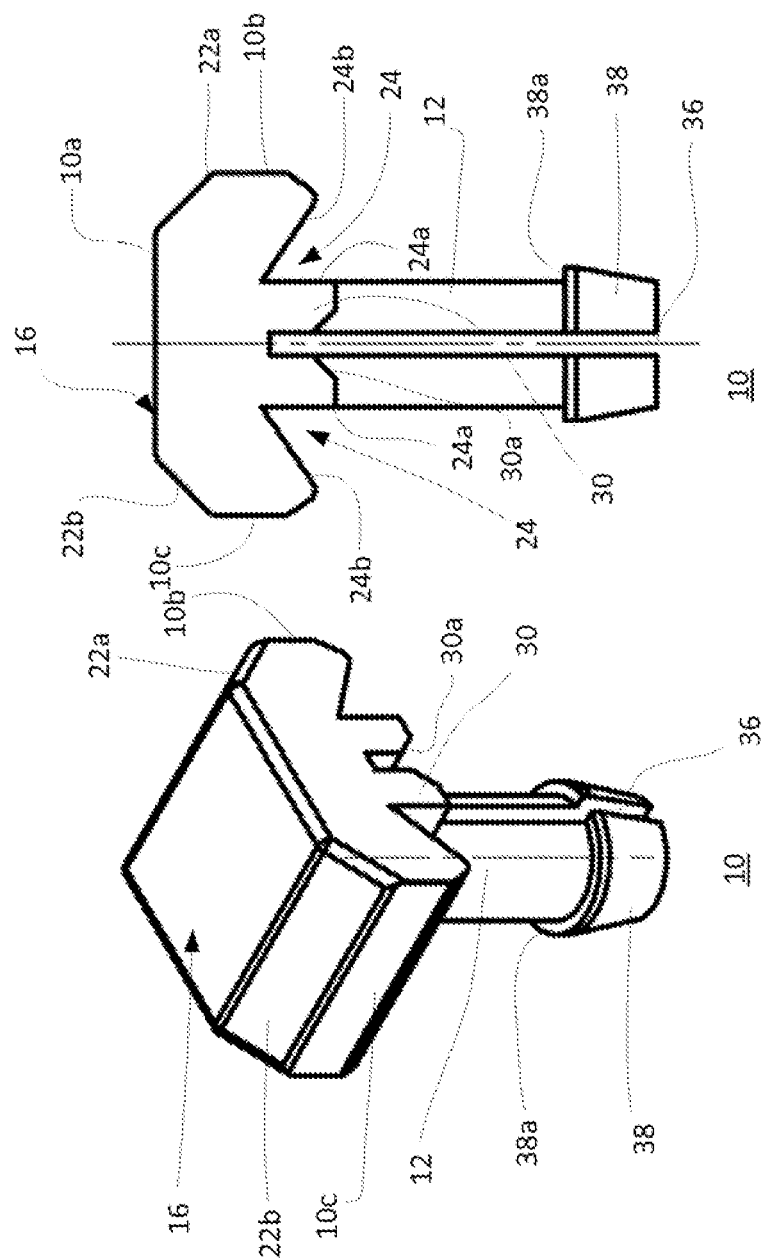

FASTENING UNIT FOR CONNECTING THERMALLY STRESSED COMPONENTS TO EACH OTHER

CROSS-REFERENCE TO RELATED APPLICATIONS

This utility patent application is a U.S. National Stage filing under 35 U.S.C. § 371 of application Ser. No. PCT/EP2018/086658, filed Dec. 21, 2018, which is an international patent application claiming priority of/to German Pat. Appl. Nos. 10 2018 100 647.0 and 20 2018 100 161.2, each filed Jan. 12, 2018, the disclosures of which are hereby incorporated by reference in their entireties.

TECHNICAL FIELD

The invention relates to a fastening unit for connecting thermally stressed components to each other. Moreover, the invention also relates to the fastening units in combination with a thermally stressed component, and to a method for connecting two thermally stressed components.

BACKGROUND

A generic fastening unit for connecting thermally stressed components to each other, in particular for connecting a heat-generating body to a heat sink, comprises a retaining pin and a retaining element. The retaining pin is connected to a retaining head. The retaining pin passes through the retaining element. The retaining head rests against the retaining element. The retaining element engages the body or the heat sink, retaining it in a fastening direction of the retaining pin. In the mounting position, the retaining head connected to the retaining pin holds the retaining element in place, which latter in turn holds the body or the heat sink in place. The retaining pin is anchored in a hole in a component, for example a heat sink, if a power module generating thermal energy is to be retained.

DE 103 06 227 A1 discloses a power module as a thermally stressed body, which comprises at least one circuit board and heat generating components. In addition, a heat sink is provided which is designed as a hollow body and through which a cooling medium flows for heat dissipation. The heat-generating components are arranged on cooling surfaces on the outside of the heat sink and are connected to these in a heat conducting manner. The heat sink is symmetrical in design and has several cooling surfaces that are arranged at an angle around a longitudinal axis of the heat sink. In the centrally arranged longitudinal axis of the heat sink, a fastening screw with a screw head is provided which connects the heat sink to the circuit board via a spider-shaped clamping spring. The clamping spring presses the heat-generating components onto the cooling surfaces of the heat sink and also serves to dissipate heat. Such a design is very complex as it requires a retaining element in the form of the spider-shaped clamping spring to be provided for each heat sink shape.

DE 196 30 173 C2 discloses a power module with semiconductor components and a circuit board on which several chip-shaped power semiconductor components and contact pads are arranged. A housing with pressure contacts is arranged on the board in order to switch the board accordingly. A pressure piece is fixed to the housing using a centrally arranged fastening screw, and the printed circuit board is firmly connected to the pressure piece. The pressure piece is made of an electrically insulating material. In order to insulate the fastening element from the housing of the circuit board, a sleeve is provided in the housing which surrounds the fastening screw. The problem with this design is that the interconnected components—circuit board, housing and pressure piece—which are made of different materials and will thus undergo different expansion when exposed to the temperature generated during operation, are not able to move relative to each other. This leads to stresses and premature material failure.

SUMMARY OF THE INVENTION(S)

It is the object of the invention to improve on a fastening unit of the type specified in the preamble of claim 1 in such a way that it will prevent stresses due to the thermal expansion of thermally stressed bodies and further bodies in a simple manner, while avoiding the above mentioned disadvantages.

This object is accomplished by the characterizing features in combination with the features specified in the preamble.

The dependent claims relate to advantageous embodiments of the invention.

According to the invention, the retaining element is designed for lateral engagement with the heat-generating body or the heat sink, in that the retaining element is provided with a retaining groove, on its side facing the heat-generating body or the heat sink, which groove extends in a longitudinal direction perpendicular to the fastening direction, with at least some areas of at least one groove surface coming into contact with the heat-generating body or the heat sink at least in the mounted state. This is a simple way to enable relative movement in the event of thermal expansion of the heat sink or the heat-generating body if mounted appropriately.

According to an advantageous further development of the invention, the retaining groove is formed in a V-shape by two groove surfaces, of which one groove surface is oriented parallel to the longitudinal axis of the fastening or retaining pin and the other groove surface is inclined with respect thereto, the groove surfaces being in particular arranged at an acute angle or an obtuse angle relative to each other. This V-shaped retaining groove allows different edge areas of heat sinks to be held in place in a simple manner without restricting movement along the retaining groove. Depending on the design of the edge area of the heat-generating body or the heat sink, or on the thermal stress to be expected, an acute angle or an obtuse angle is useful. This will result in a linear or flat contact of at least one groove surface of the retaining groove with the heat-generating body or the heat sink to be held in place.

Preferably, the retaining element has a rectangular base area. As a result, it is easy to manufacture but can also be easily aligned with the body to be held in place during assembly. In particular, the retaining element has a greater length in the longitudinal direction of the retaining groove than perpendicular to the longitudinal direction of the retaining groove.

According to a further embodiment of the invention, the retaining element is symmetrically formed and has two retaining grooves so that the retaining element can come to rest against different adjacent heat-generating bodies or heat sinks at the same time. This extends its range of application and increases the flexibility of the fastening unit.

In order to protect in particular the retaining element against rotation relative to the heat-generating body or the heat sink to be retained, it has proved advantageous for the retaining element to have, at its center, to the side of the retaining pin, an elongated projection that extends perpendicular to the retaining pin, which projection in turn has a further groove on its side remote from the retaining head. This groove engages in particular with a strip. This results in a positive engagement in the direction of rotation, but which will not impair movement relative to the retaining groove due to thermal expansion. This thus prevents twisting of the retaining element, while still allowing thermal expansion in the longitudinal direction of the groove and the retaining groove arranged parallel to it.

Preferably, the other groove is also V-shaped. This is a simple way of obtaining linear contact as well as planar contact, depending on the design of the contact surface of the heat-generating body or the heat sink to be held in place that is located opposite the groove.

To prevent the fastening unit from being too high, the retaining head engages in a recess in the retaining element and rests against it there.

In particular, the retaining head and the recess of the retaining element are of a cylindrical design, with one end face of the retaining head resting against the end face of the recess, thus allowing a relative compensating movement about the cylinder axis. During assembly, this is important for the purpose of aligning the retaining element relative to the body or the heat sink to be held in place. In addition, in certain designs of the bodies and heat sinks, this can also be advantageous for compensating for stresses.

As an alternative, however, the side of the retaining head facing the recess can also be at least partially spherical, with the recess being of a partially spherical shape to match the retaining head, so that the spherical surfaces facing each other enable a compensating movement relative to each other in the manner of a ball joint. This ensures that any thermal expansion of the heat-generating body and the heat sink that are connected to each other will not result in stresses due to torques.

The retaining pin may have a thread provided on its end remote from the retaining head, which thread is adapted to engage a thread in a hole in the heat sink or the heat-generating body. This allows the fastening unit and thus the heat-generating body and the heat sink to be screwed together via the fastening unit.

Alternatively, the retaining pin can have at least one detent means at its end remote from the retaining head, which is adapted to engage an undercut in a bore in the heat sink or the heat-generating body. The retaining pin is slotted at its end remote from the retaining head. Using a latching connection, the heat-generating body and the heat sink can be connected to each other via the fastening unit. This simplifies mounting.

Preferably, the heat-generating body is constituted by a power semiconductor. Power semiconductors generate a lot of heat and thus must be cooled by means of heat sinks. The fastening units according to the invention are particularly suitable for this, as the heat sinks will undergo expansion.

The heat sink can be an air heat sink and/or a liquid heat sink.

According to one embodiment of the invention, the retaining head of the fastening unit consists of a thermally and/or electrically insulating material, or of an electrically conductive material.

According to another aspect thereof, the invention is characterized by at least two fastening units of the above mentioned type for connecting a heat sink and a heat-generating body to each other, in which two fastening units are mounted on the heat-generating body or the heat sink diametrically opposed from each other and form a floating bearing with the heat-generating body or the heat sink. This is an easy way to allow a relative movement to take place between the heat-generating body and the heat sink along the retaining grooves of the retaining elements of the fastening units.

When mounted, the retaining grooves of the fastening units are in particular aligned parallel to each other.

According to another aspect, the invention is generally characterized by a method for connecting two thermally stressed components to each other, in particular a heat sink and a heat-generating body, by means of a floating bearing which will allow movement of the one component relative to the other component at least along one axis, in particular using a fastening unit of the aforementioned type.

Additional advantages, features and possible applications of the present invention may be gathered from the description which follows, in which reference is made to the embodiments illustrated in the drawings.

BRIEF DESCRIPTION OF THE DRAWINGS

Throughout the description, the claims and the drawings, those terms and associated reference signs are used as are indicated in the list of reference signs below. In the drawings:

FIG. 2a is a schematic lateral view of a fastening unit according to a second embodiment of the invention;

FIG. 2b is a perspective view of the fastening unit of FIG. 2a, taken at an angle from above;

FIG. 2c is an exploded version of the view of FIG. 2b;

FIG. 3a is a schematic lateral view of a fastening unit according to a third embodiment of the invention;

FIG. 3b is a perspective view of the fastening unit of FIG. 3a, taken at an angle from above;

FIG. 4a is a schematic lateral view of a fastening unit according to a fourth embodiment of the invention;

FIG. 4b is a perspective view of the fastening unit of FIG. 4a, taken at an angle from above;

DETAILED DESCRIPTION OF THE DRAWINGS

Figures 1A, 1B:
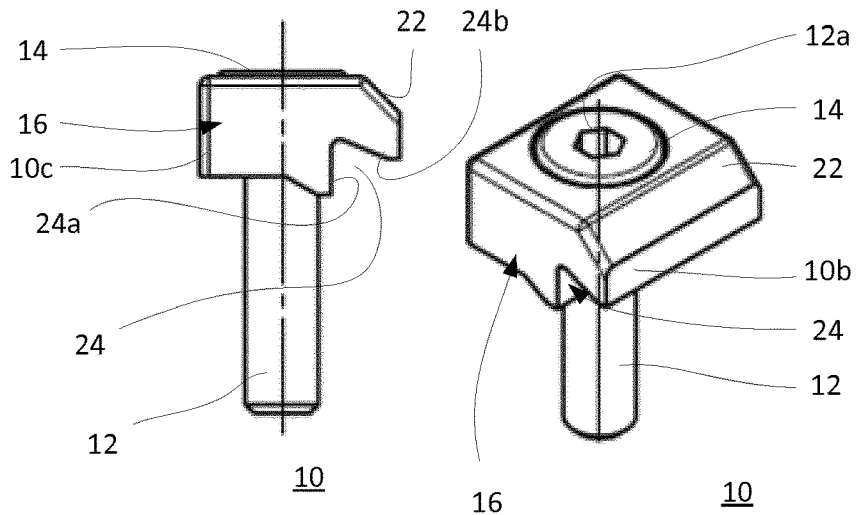
FIG. 1a is a schematic lateral view of a fastening unit according to a first embodiment of the invention.
FIG. 1b is a perspective view of the fastening unit of FIG. 1a, taken at an angle from above.
Figure 1C:
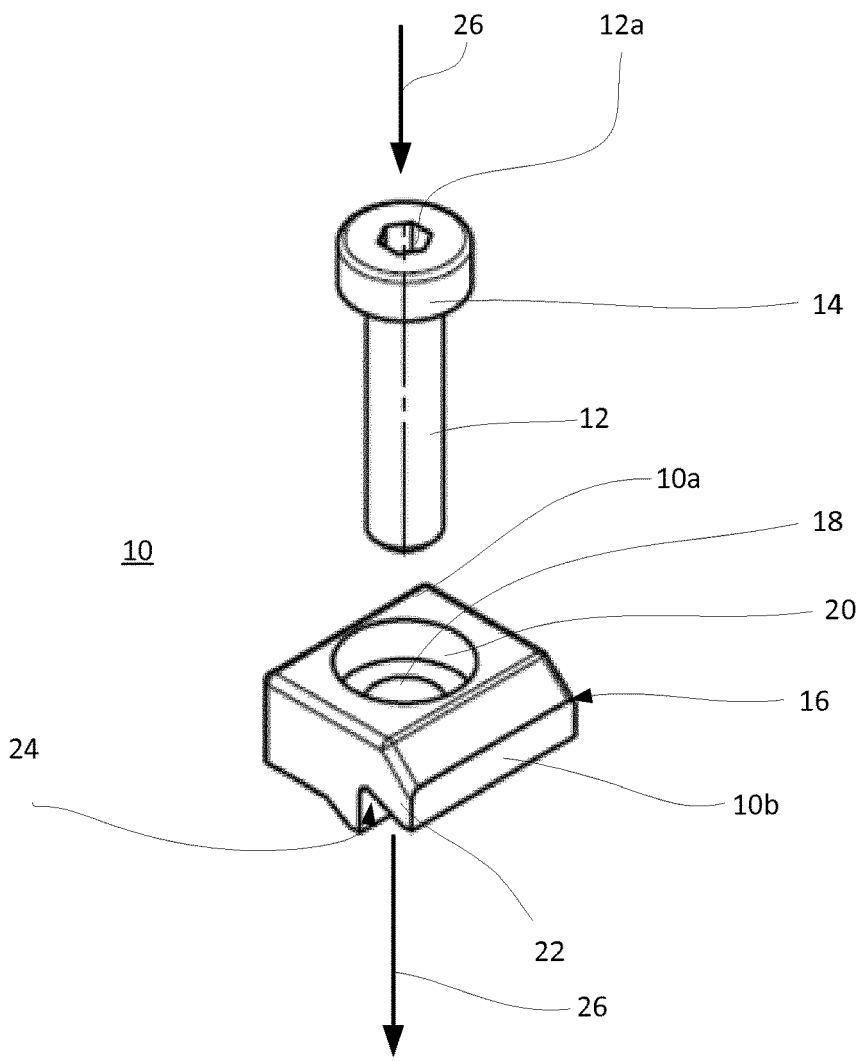
FIG. 1c is an exploded version of the view of FIG. 1b.

Illustrated in FIGS. 1a, 1b and 1c is a first embodiment of a fastening unit 10. The fastening unit 10 comprises a retaining pin 12 that is integrally connected to a retaining head 14. In the present case, the retaining pin 12 and the retaining head 14 are made in one piece. The retaining head 14 is cylindrical and has a hexagon socket 12a which the retaining pin 12 is screwed into during assembly. The hexagon socket 12a constitutes an internal drive for the retaining pin 12.

In addition, the fastening unit 10 comprises a retaining element 16 which has a through-hole 18 as well as a cylindrical recess 20 arranged concentrically thereto on its upward facing side 10a. Viewed from above, the basic shape of the retaining element 16 is rectangular. In the longitudinal direction, the retaining element 16 is longer than in the transverse direction. On a first long side 10b, a retaining arm 22 protrudes along the entire long side 10b, extending at an angle relative to the upward facing side 10a. A V-shaped retaining groove 24 that is parallel to the long side 10a is provided underneath the retaining arm 22, in which the groove surface 24a nearest to the through-hole 18 extends parallel to the through-hole 18 and the further groove surface 24b extends at an angle thereto.

As can be seen in particular in FIG. 1a, the groove surfaces 24a and 24b of the retaining groove 24 form an acute angle between them.

The groove surface 24a is extended downwards and part of the underside of the retaining element 16 is slanted relative to the groove surface 24a.

The retaining pin 12 with the retaining head 14 is inserted in the through-hole 18 in the fastening direction, which is designated by the reference sign 26, until the end face of the retaining head 14 comes to bear against the upward facing surface of the recess 20. In this state, the upper face of the retaining head 14 is flush with the upward facing side 10a.

As the retaining pin 12 with its retaining head 14 is inserted into the through-hole 18 and the recess 20 of the retaining element 16, the retaining pin 12 will also be anchored in a heat sink or other component, as will be described in more detail below.

The views of FIGS. 2a, 2b and 2c illustrate a second embodiment of the invention. Similar to the fastening unit 10 of FIG. 1a, FIG. 1b and FIG. 1c, this embodiment also features the retaining pin 12 with its retaining head 14. Only its retaining element 16 is designed differently in that on both long sides 10b and 10c, a retaining arm 22a, 22b protrudes laterally along the entire long side 10b and 10c respectively, a retaining groove 24c, 24d is provided under each retaining arm 22a, 22b and the groove surface 24a running parallel to the through hole 18 is extended downwards. This results in a web that extends laterally relative to the retaining pin 12 and has a central groove 30. The retaining element 16 is of a symmetrical design with two retaining grooves 24c and 24d and a further central groove 30. The groove 30, the web 30a and the retaining grooves 24c and 24d are parallel to each other and perpendicular to the longitudinal axis and fastening direction 26 of the fastening unit 10.

Figure 3C:
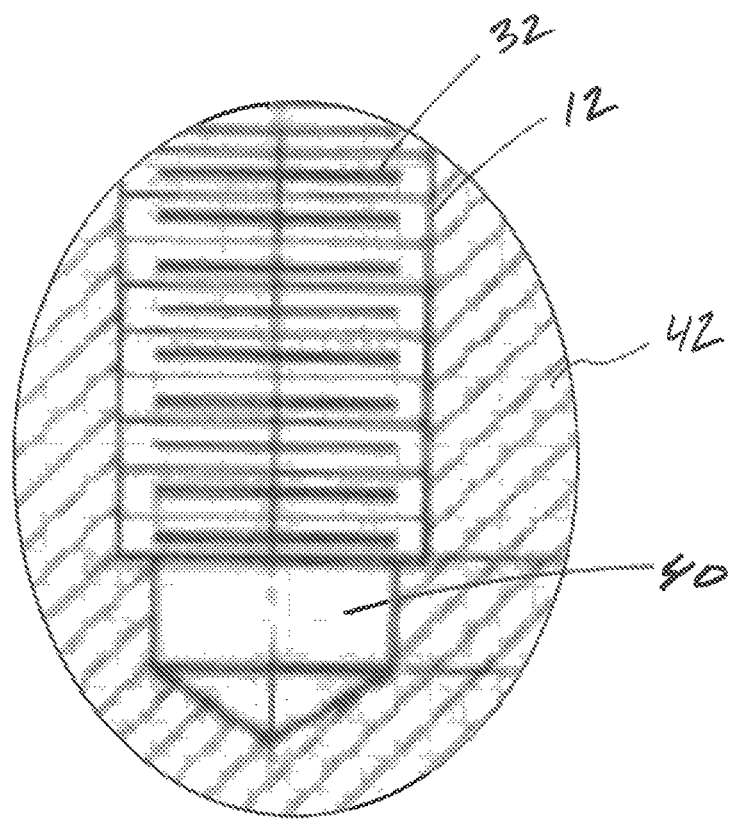
FIG. 3c illustrates a threaded interface between the retaining pin of the fastening unit and a work piece.

FIGS. 3a and 3b are views each of a third embodiment of the invention which essentially corresponds to the second embodiment, wherein the retaining pin 12 has a thread 32 that is adapted to engage a thread in a heat sink (FIG. 3c). The retaining pin 12 is thus designed for being screwed into an associated thread.

Figure 4C:
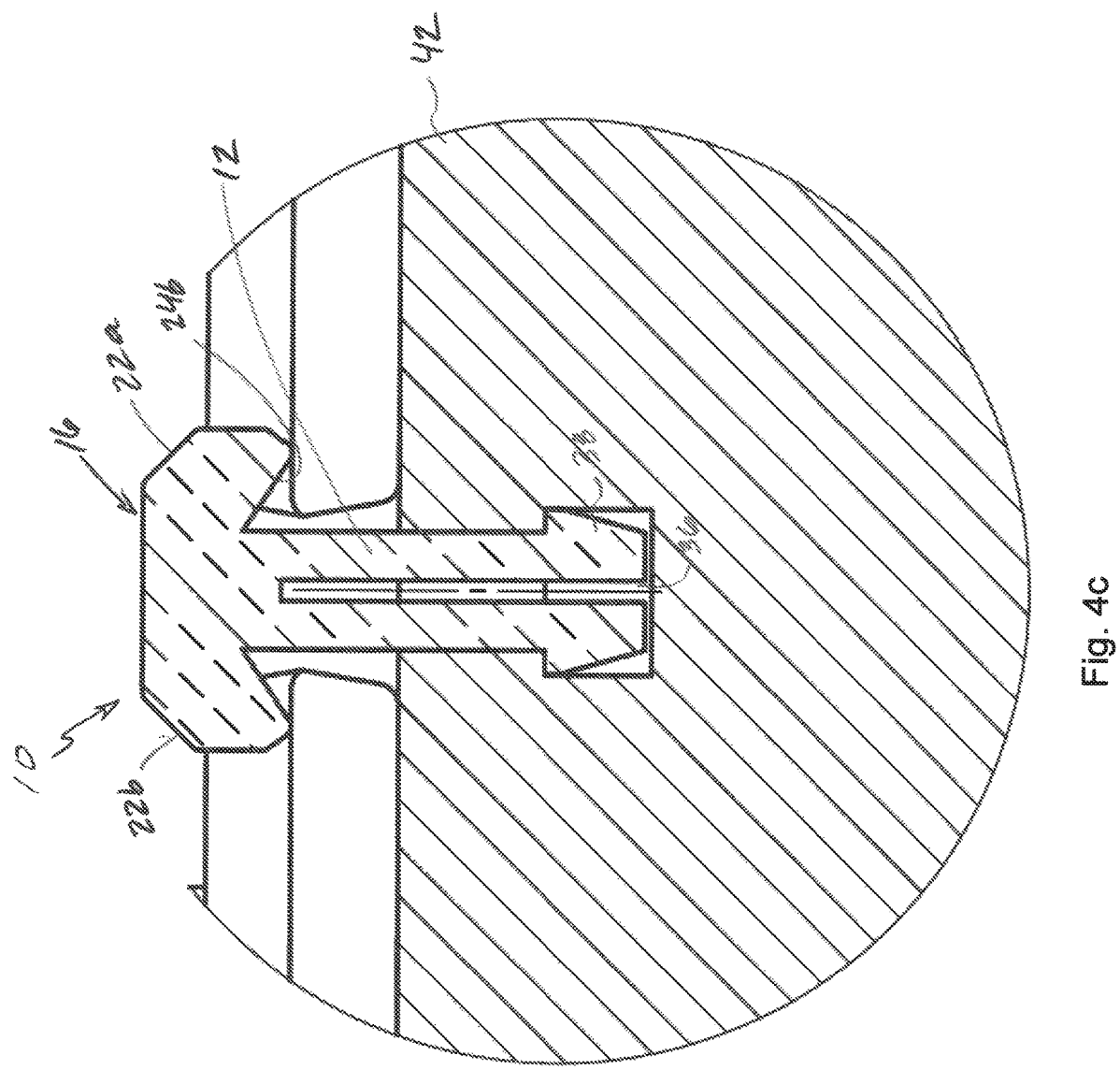
FIG. 4c illustrates a detent interface between the retaining pin of the fastening unit and a work piece.

Illustrated in FIGS. 4a and 4b is a fourth embodiment of the invention which substantially corresponds to the second embodiment thereof, wherein the retaining pin 12 has a slot 36 that extends from its free end 34 into the retaining element 16. In addition, the retaining pin 12 and the retaining element 16 are integrally formed and manufactured in one piece. A detent 38 is provided on the free end 34, which forms a shoulder 38a and decreases towards the free end 34. The retaining pin 12 and the detent 38 are substantially cylindrical or conical in shape. An undercut is made in a hole in a heat sink. In the mounted condition, the detent 38 engages in this undercut and the shoulder 38a comes to bear against the undercut. The detent 38 serves to anchor the fastening unit 10 in the hole (FIG. 4c).

Figure 5:
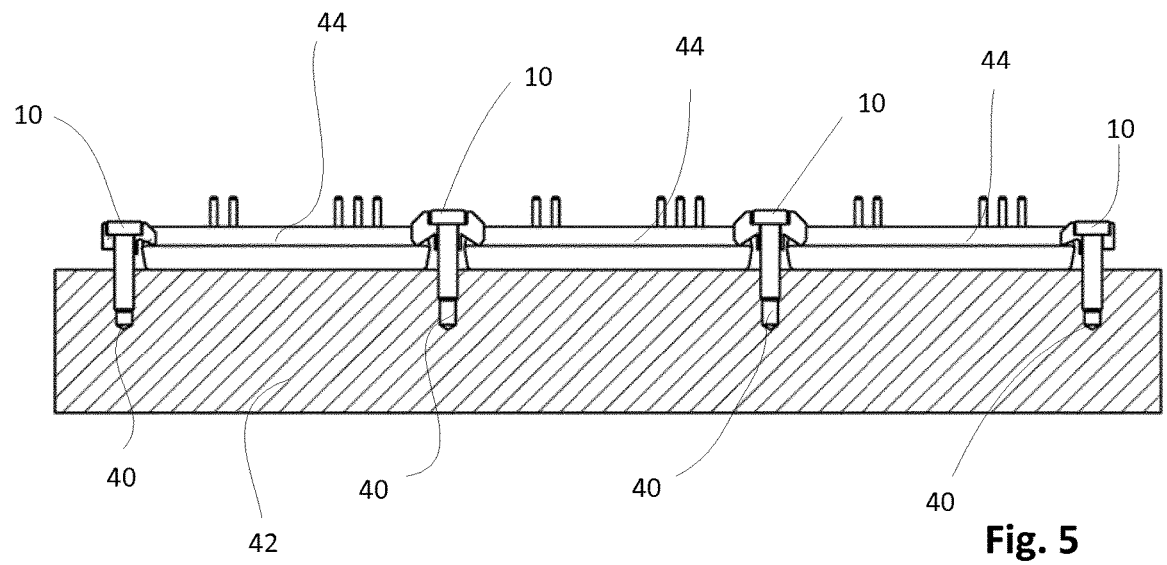
FIG. 5 is a sectional view of a first application example of the third embodiment of the invention, in its mounted state.
Figure 6:
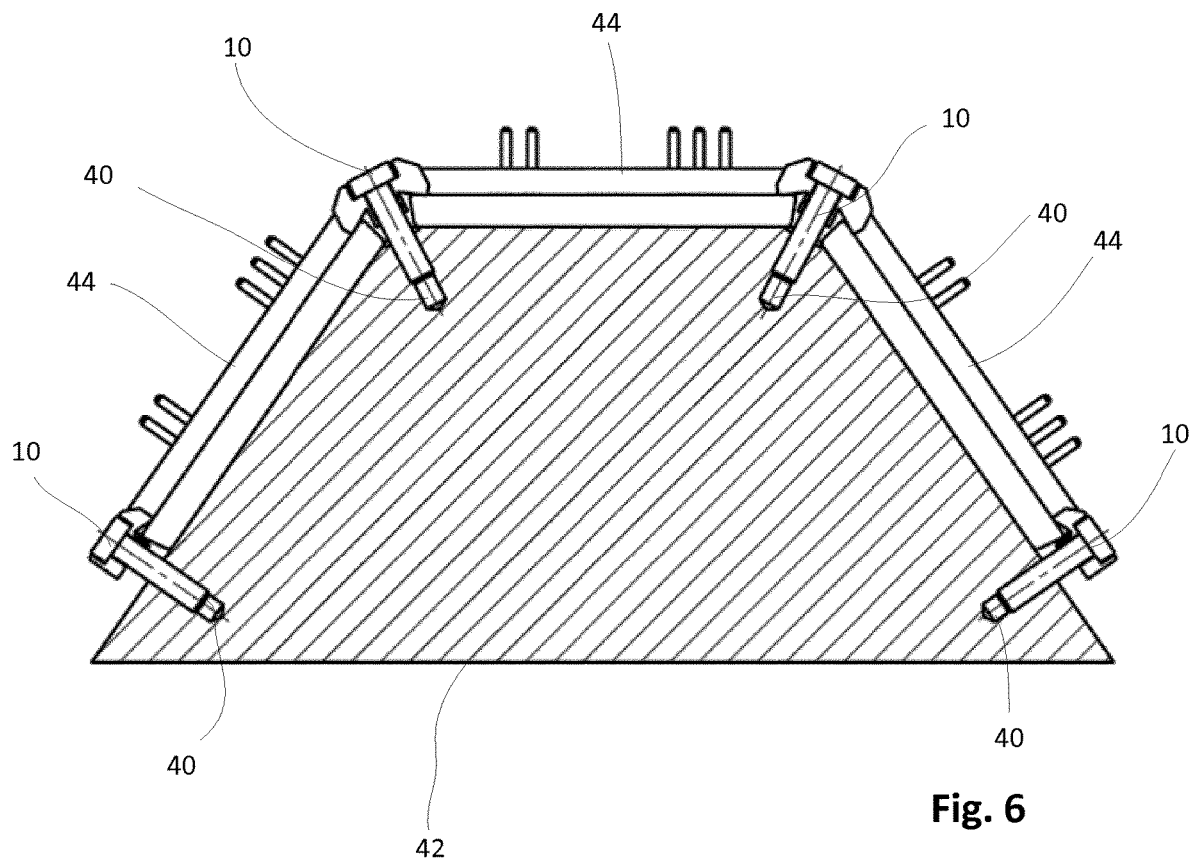
FIG. 6 is a sectional view of a second application example of the third embodiment of the invention, in its mounted state.
Figure 7:
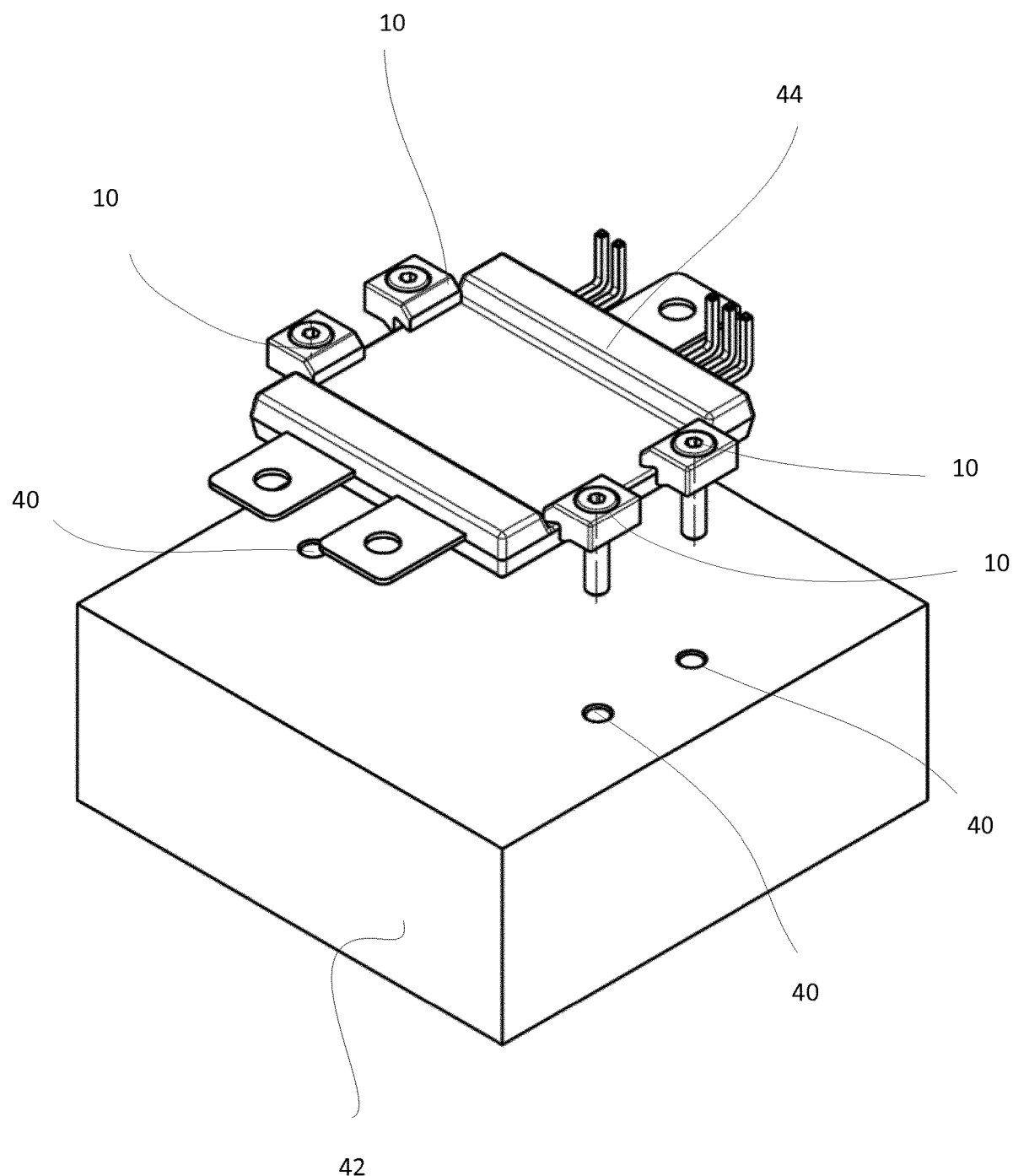
FIG. 7 is a sectional view of a third application example of the first embodiment of the invention, in its mounted state
Figure 8:
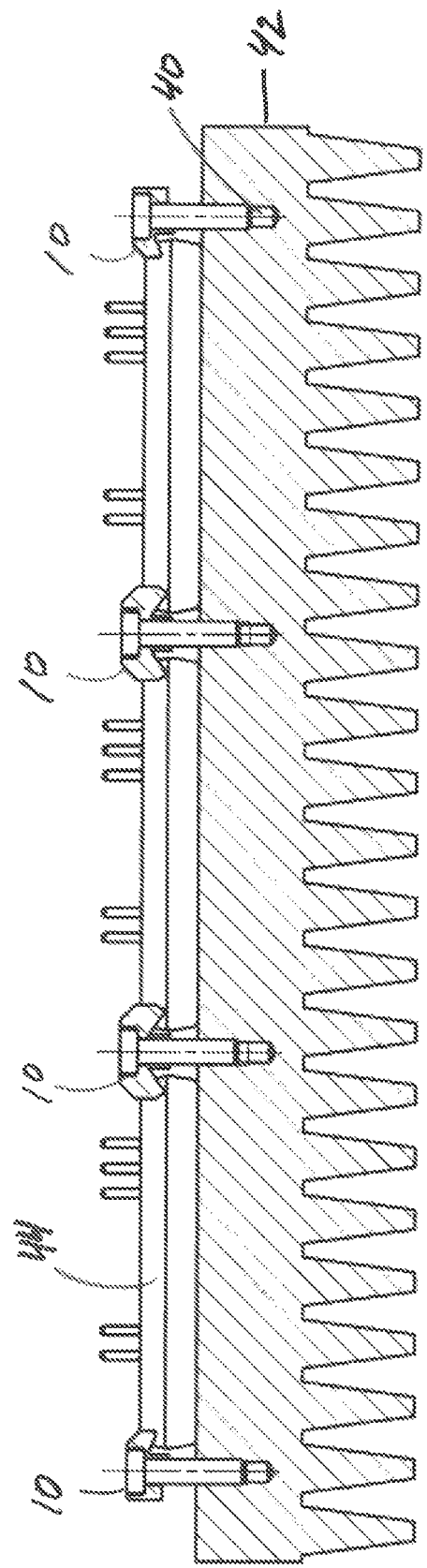
FIG. 8 is a depiction as FIG. 5 wherein the heat sink is an air cooled heat sink.
Figure 9:
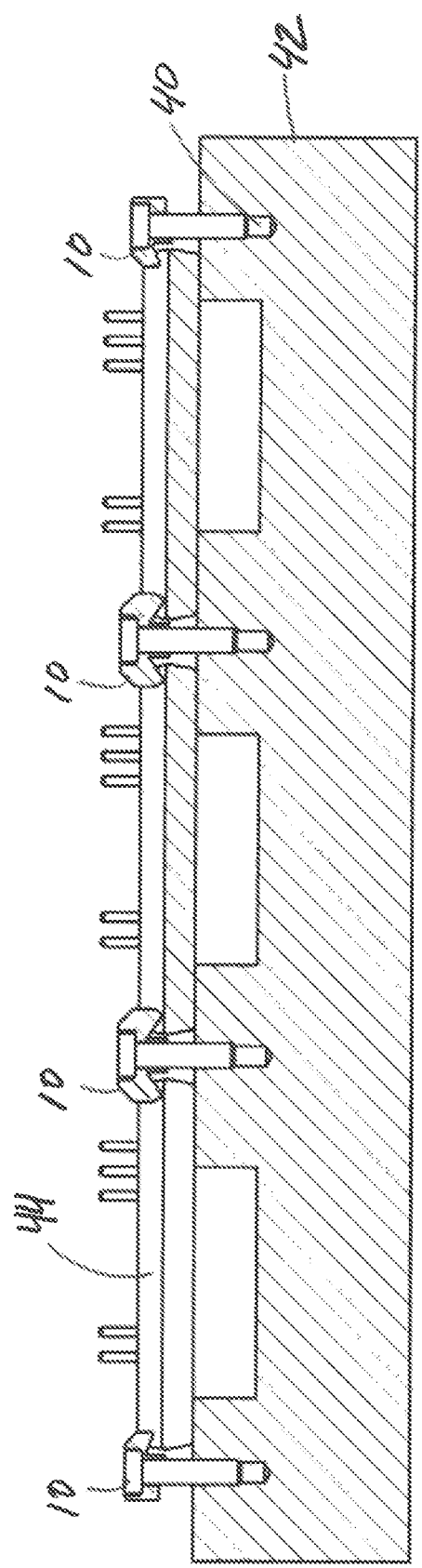
FIG. 9 is a depiction as FIG. 5 where the heat sink is a liquid cooled heat sink; and, FIG. 10 is a depiction as FIG. 5 where the heat sink is an air and liquid cooled heat sink.
Figure 10:
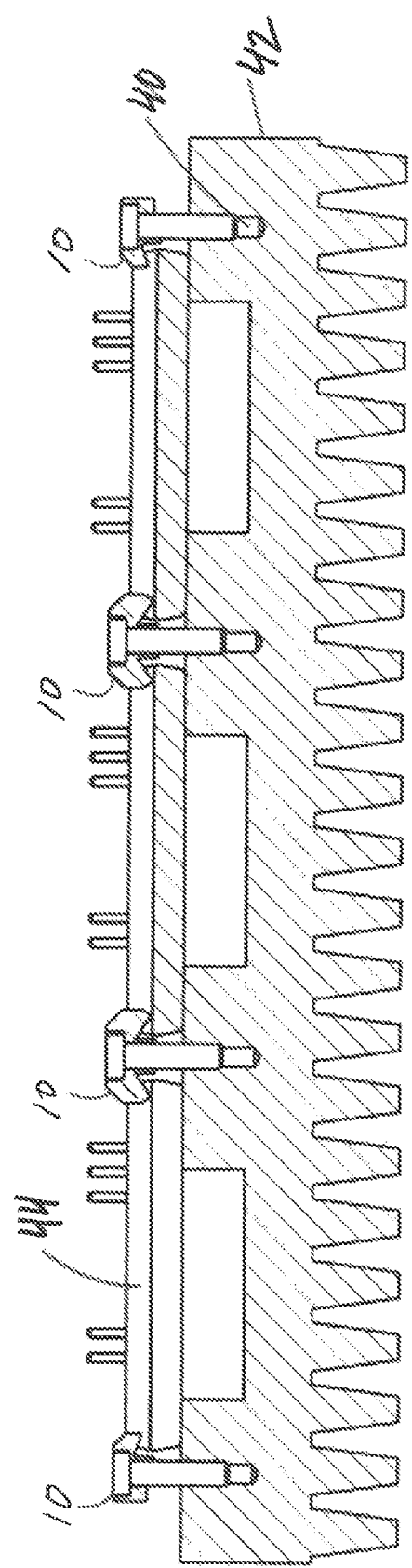

FIGS. 5 to 7 are illustrations of different embodiment examples of applications of the fastening units 10 according to the invention. Each of FIGS. 8-10, not inconsistent with the FIG. 5 application embodiment, show variations in/for the heat sink.

FIGS. 5 and 6 are views each of fastening units 10 according to the first and third embodiments with a retaining pin having a thread 32, and are each screwed into a threaded hole 40 of a heat sink 42 (FIG. 3c).

In FIG. 5, the heat sink 42 is substantially cuboidal. On its top side, power semiconductors 44 that generate thermal energy are connected to the heat sink via the fastening units 10 in a manner such that the retaining arms 22 with retaining grooves 24 of the fastening units will each come to rest against the edge of the power semiconductor 44. Provided on the outer sides of the heat sink are fastening units 10 according to the first embodiment of the invention, which engage only on one edge of a power semiconductor 44 to hold it in place, while fastening units 10 according to the third embodiment of the invention are provided in the central region, whose retaining arms 22a, 22b and retaining grooves 24c, 24d engage on the edges of two different power semiconductors 44 to hold them in place. The retaining arms 22a, 22b with their retaining grooves 24c, 24d each rest against the edge of the power semiconductor 44 in a linear or flat manner. All retaining grooves 24 of the fastening units 10 are aligned parallel to each other.

FIG. 6 is a cross-sectional view of a trapezoidal heat sink. The power semiconductors 44 are also arranged on the top side of the heat sink 42 in this case. On the outer side of the heat sink 42, fastening units 10 according to the first embodiment are screwed into the heat sink 42 and hold a power semiconductor 44 in place at the edge. In the central area, fastening units 10 according to the third embodiment are screwed into a corresponding hole at the edges of the heat sink 42, thus engaging and holding two adjacent power semiconductors 44 each. It becomes clear from this view that the V-shaped retaining grooves 24 provide an easy way to hold power semiconductors 44 in place that are arranged at an angle relative to each other, without the retaining elements 16 having to be adjusted for this purpose.

The view of FIG. 7 illustrates how the fastening units 10 are arranged in the heat sink 42 and relative to the edge of the power semiconductor. The retaining pins 12 are screwed into assigned holes 40 in the heat sink 42. These units are fastening units 10 according to the first embodiment.

The use of retaining grooves 24 and the attachment of the fastening units 10 on opposite sides make it possible for the power semiconductors 44 to expand parallel to the retaining grooves 24. Stresses are thus avoided. For example, two fastening units 10 are arranged on each long side of a power semiconductor 44. Depending on whether the fastening units 10 are to hold one or two adjacent power semiconductors 44 in place, the embodiment of the fastening unit 10 having one retaining arm 22 or the embodiment having two retaining arms 22a, 22b will be used. The power semiconductors 44 are thus held in place by a floating bearing, meaning that movement in one direction will be possible. This direction is the main expansion direction of the power semiconductor 44.

The distance of two power semiconductors 44 relative to each other, but also the distance of the hole for the retaining pin 12 from the edge of the power semiconductor 44 can be adjusted via the length of the lateral protrusion of the retaining arms 22.

Preferably, one set of retaining elements 16 is provided which have retaining arms 22 that protrude at different lengths. Depending on requirements, the retaining element 16 will then be used that has a longer protruding retaining arm 22 or a shorter protruding retaining arm 22. The retaining pin 12 with its retaining head 14 may remain the same for the different retaining elements 16. However, retaining pins 12 of different lengths and diameters can also be provided for assembly.

Depending on the individual application, the fastening units 10 can be designed to be electrically conductive, electrically insulating, thermally conductive or thermally insulated. It is also possible for the retaining elements 16 on the one hand and the retaining pin 12 with its retaining head 14 on the other hand to have different material properties.

In a simple manner, the fastening units 10 according to the invention therefore allow an expansion of the power semiconductors 44 and thus a relative movement between power semiconductor 44 and heat sink 42. Firm anchoring of the retaining pins 12 prevents elastic deformation along the fastening axis. This is a simple way of preventing stresses in operation.

LIST OF REFERENCE SIGNS

10 fastening unit
10*a* side facing upwards
10*b* long side—right
10*c* long side—left
12 retaining pin
12*a* hexagon socket, internal drive
14 retaining head
16 retaining element
18 through-hole
20 recess
22 retaining arm
22*a* retaining arm—left
22*b* retaining arm—right
24 retaining groove
24*a* groove surface parallel to through-hole 18
24*b* groove surface slanted relative to through-hole 18
24*c* retaining groove—left
24*d* retaining groove—right
26 fastening direction
28 web
30 additional groove
30*a* web
32 thread
34 free end
36 slot
38 detent
40 bore
42 heat sink
44 power semiconductor

The invention claimed is:

1. Fastening unit for connecting a heat-generating body to a heat sink, the fastening unit comprising a retaining pin and a retaining element wherein the retaining pin is connected to a retaining head, the retaining pin extends through the retaining element, the retaining head contacts the retaining element, the retaining element engageable upon a body of the heat sink so as to retain same in a fastening direction of the retaining pin, the retaining element engageable laterally on the body of the heat sink, the retaining element having, on a side thereof for facing the body of the heat sink, a retaining groove extending in a longitudinal direction perpendicular to the fastening direction, wherein, in an assembled state for the fastening unit, at least one groove surface of the retaining groove of the retaining element contacts the body of the heat sink.

2. Fastening unit according to claim 1, wherein the retaining groove is formed in a V-shape by two groove surfaces, one groove surface being aligned parallel to a longitudinal axis of the retaining pin, another groove surface being inclined relative thereto, the two groove surfaces extending at an acute or obtuse angle to one another.

3. Fastening unit according to claim 1, wherein a base area of the retaining element is substantially rectangular.

4. Fastening unit according to claim 1, wherein the retaining element has a greater length in the longitudinally extending direction of the retaining groove than transversely to the longitudinally extending direction of the retaining groove.

5. Fastening unit according to claim 1, wherein the retaining element includes two retaining grooves, the retaining element having a structural symmetry about a centerline thereof so as to enable the retaining element to bear against first and second adjacent heat-generating bodies or heat sinks simultaneously.

6. Fastening unit according to claim 5, wherein at its center, to a side of the retaining pin, the retaining element has an elongated projection that extends perpendicularly to the retaining pin, the elongated projection having a further groove in a side thereof remote from the retaining head.

7. Fastening unit according to claim 6, wherein the further groove is V-shaped.

8. Fastening unit according to claim 1, wherein the retaining head engages in, and bears against, a recess of the retaining element.

9. Fastening unit according to claim 8, wherein the retaining head is cylindrical and the recess is of cylindrical shape, an end face of the retaining head thereby resting on an end face of the recess thus enabling a relative compensating movement about a common cylinder axis for the retaining head and the recess of the retaining element.

10. Fastening unit according to claim 8, wherein the retaining head is at least partially spherical on a side facing the recess, the recess has a partially spherical shape adapted to conform to a portion of the retaining head so that cooperative engaged spherical surfaces permit a compensating movement relative to one another.

11. Fastening unit according to claim 1, wherein the retaining pin has a thread at an end remote from the retaining head, the thread adapted to engage a thread in a bore of the heat sink or of the heat-generating body.

12. Fastening unit according to claim 1, wherein at an end remote from the retaining head, the retaining pin has at least one detent adapted to engage an undercut of a bore in the heat sink or of the heat-generating body, and the retaining pin is slotted in a region of the end remote from the retaining head.

13. Fastening unit according to claim 1 in operative combination with a heat sink and a heat-generating body, the heat-generating body comprising a power semiconductor.

14. Fastening unit according to claim 1 in operative combination with a heat sink and a heat-generating body, the heat sink comprising an air cooled heat sink and/or a liquid cooled heat sink.

15. Fastening unit according to claim 1, wherein the retaining head comprises a thermally and/or an electrically insulating material, or an electrically conductive material.

16. In operative combination, at least two fastening units according to claim 1 for connecting a heat sink and a heat-generating body to each other, wherein the at least two fastening units are mounted opposite one another on an edge of the heat-generating body or the heat sink so as to form a floating bearing.

17. In the operative combination according to claim 16, wherein in a mounted state, the retaining grooves of the fastening units are aligned parallel to each other.

* * * * *